United States Patent

Kibbel et al.

[11] Patent Number: 5,039,501
[45] Date of Patent: Aug. 13, 1991

[54] METHOD FOR GROWING SILICON CARBIDE WHISKERS

[75] Inventors: Bradley W. Kibbel, Ferndale; Gerald E. Sokol, Rochester, both of Mich.

[73] Assignee: General Motors Corporation, Detroit, Mich.

[21] Appl. No.: 508,981

[22] Filed: Apr. 12, 1990

[51] Int. Cl.⁵ ............................................. C01B 31/36
[52] U.S. Cl. ........................................ 423/346; 501/88
[58] Field of Search ................. 423/345, 346; 501/88, 501/90, 91

[56] References Cited

U.S. PATENT DOCUMENTS

| | | | |
|---|---|---|---|
| 4,536,379 | 8/1985 | Carlson et al. | 423/345 |
| 4,605,542 | 8/1986 | Harada | 423/345 |
| 4,855,119 | 8/1989 | Minamikata et al. | 423/345 |

FOREIGN PATENT DOCUMENTS

| | | | |
|---|---|---|---|
| 58-213698 | 4/1982 | Japan | 423/345 |
| 61-17499 | 1/1986 | Japan . | |
| 61-22000 | 1/1986 | Japan . | |
| 61-101500 | 5/1986 | Japan . | |
| 62-003098 | 1/1987 | Japan . | |
| 63-206399 | 8/1988 | Japan . | |
| 63-319300 | 12/1988 | Japan . | |
| 83/02108 | 6/1983 | World Int. Prop. O. | 423/345 |

OTHER PUBLICATIONS

Egashira et al., Growth of beta-silicon carbide whiskers from vapor phase via silicon sulfide intermediate, Yogyo Kyokaishi, 93(9), 535-40.

Primary Examiner—Olik Chaudhuri
Assistant Examiner—Ken Horton
Attorney, Agent, or Firm—Lawrence B. Plant

[57] ABSTRACT

Method for rapidly growing silicon carbide whiskers having high aspect ratios comprising heating a carbon substrate to between about 1600° C. and 1800° C. and thereat contacting the substrate with a reactive atmosphere consisting essentially of gaseous species of silicon, carbon, nitrogen, sulfur and a group II metal selected from the group consisting of calcium, magnesium and barium.

15 Claims, 6 Drawing Sheets

METHOD FOR GROWING SILICON CARBIDE WHISKERS

This invention relates to a method of growing silicon carbide whiskers and more particular to a high temperature, vapor-solid reaction method for making such whiskers.

BACKGROUND OF THE INVENTION

Silicon carbide whiskers have been proposed for use as reinforcements for light metals (e.g., aluminum and magnesium), ceramics and polymers. Materials so reinforced are referred to as metal matrix composites, ceramic matrix composites and polymer matrix composites, respectively.

Silicon carbide whiskers are typically made using either a vapor-solid reaction, often referred to as a V-S process, or a vapor-liquid-solid reaction, often referred to as a V-L-S process. In the V-S process, vapor containing silicon and carbon species react directly to form solid silicon carbide whiskers on a carbon (e.g., graphite) substrate. The V-L-S process is similar to the V-S process but also includes molten droplets of ferrous alloys on the carbon substrate which serve to initiate the silicon carbide whisker formation at the interface between the droplet and the carbon substrate. In both processes, the silicon carbide continues to grow from the tip of the previously formed silicon carbide.

Typically, V-L-S process-formed silicon carbide whiskers have diameters of about 1–3 microns, have lengths up to about 3 millimeters, have a smooth surface, form at a faster rate than V-S process-formed silicon carbide, and are characterized by a small bead of metal at the tip of the whisker. Silicon carbide formed by the V-S process tends to have diameters less than 1 micron, lengths of about 20 microns and a rougher surface than the V-L-S process-formed silicon carbide. Both the V-S and V-L-S processes are typically carried out at temperatures between 1400° C. and 1600° C. and are believed by many to result from the following reaction:

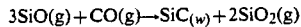

$$3SiO(g) + CO(g) \rightarrow SiC_{(w)} + 2SiO_2(g)$$

It is an object of the present invention to provide a high temperature (i.e., 1600° C.–1800° C.) V-S type process which rapidly grows long (i.e., aspect ratios as high as 200:1), smooth silicon carbide whiskers having average diameters greater than about 1 micron which process is carried out in a nitrogenous atmosphere in the presence of sulfur vapor and a group II metal vapor selected from the group consisting of calcium, magnesium and barium. This and other objects and advantages of the present invention will become more readily apparent from the detailed description thereof which follows and which is described hereafter in conjunction with the several Figures in which:

THE INVENTION

Figure 1:
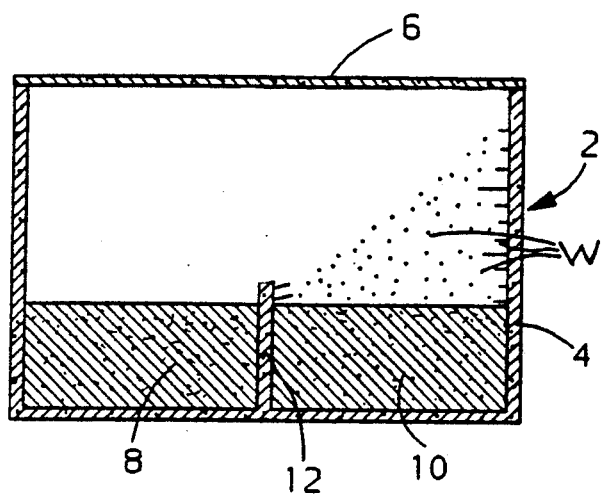
FIG. 1 illustrates a sectioned side view of one embodiment of a reactor for carrying out the process of the present invention.

The present invention provides a method for growing silicon carbide whiskers on a carbon substrate wherein the substrate is heated to a temperature of at least about 1600° C. and less than about 1800° C., and thereat contacted with a hot reactive atmosphere consisting essentially of gaseous or vaporous species of silicon, carbon, nitrogen, sulfur and a group II metal selected from the group consisting of calcium, magnesium and barium. This atmosphere will preferably be formed by heating sources of silicon, carbon, sulfur and a group II metal together in an appropriate reactor bathed in nitrogen. Contact between the reactive atmosphere and the carbon substrate will preferably be maintained for a time sufficient to produce whiskers having a mean diameter greater than about 1 micron and an aspect ratio (i.e., length divided by diameter) significantly greater than 20 and as high as 200 or more. Preferred silicon sources include silicon dioxide (SiO$_2$) and silicon nitride (Si$_3$N$_4$). The sulfur source will preferably comprise elemental sulfur but may also comprise sulfur compounds which thermally decompose at the reaction temperatures to provide high concentrations of sulfur in the reactive atmosphere without adding hydrogen to the atmosphere. The carbon source may be particulate carbon black or graphite mixed with the silicon and sulfur sources or carbon/graphite on the inside surface of the reactor in which the reaction takes place. The group II metal vapor source is an oxide or sulfide of calcium, barium or magnesium heated to the reaction temperature which provides sufficient group II metal vapor in the atmosphere to accelerate the growth rate of the whiskers. The silicon source will preferably comprise silicon dioxide (e.g., sand) owing to its cheapness and ready availability, while the group II metal source will preferably comprise lime (CaO) which is likewise inexpensive, readily available and provides the highest yield of the other group II metals. The reaction will preferably, be carried out in a closed reactor or boat made from, or lined with, graphite and caused to traverse the length of a tube furnace through which nitrogen gas flows. A small amount of hydrogen (e.g., about 4%) may be mixed with the nitrogen, but a hydrogen-free atmosphere is preferred for best yields.

In accordance with one embodiment of the present invention, the reactor is partitioned into two compartments with the silicon and sulfur sources being mixed together in one compartment and the group II metal source placed in the other compartment as will be discussed hereinafter in conjunction with FIGS. 1 and 3. In another embodiment, the silicon and sulfur sources are mixed together in the reactor and the group II metal source positioned contiguous the reactor as will be discussed hereinafter in conjunction with FIG. 2. In still another embodiment the silicon, sulfur and group II metal sources are all mixed together along with carbon particles as will be discussed hereafter in conjunction with the embodiment shown in FIG. 4. The reactors themselves will preferably comprise graphite or a graphite-lined ceramic (e.g., Al$_2$O$_3$) which is capable of withstanding the high temperatures of the present invention. It is preferred to grow the whiskers at a temperature of about 1750°–1800° C. which results in the highest yield, fastest growth rate and whiskers having the largest average diameter.

FIGS. 1–4 illustrate four different ways in which silicon carbide whiskers may be grown in accordance with the present invention. In all cases a reactor 2 comprising a graphite crucible 4 and graphite lid or cover 6 is used to contain the reactants. Preferably, a plurality of reactors 2 will be sequentially fed into one end of a continuous furnace heated to the requisite temperature and passed through the furnace at a speed which insures that the reactor is held at the desired temperature for a sufficient time to grow the silicon carbide whiskers to the desired dimensions before exiting the other end of the furnace. The furnace is continuously maintained in an atmosphere of nitrogen flowing therethrough.

In the embodiment shown in FIG. 1, the crucible 4 is divided into two compartments 8 and 10 by a partition 12. A mixture comprising sulfur and the silicon source e.g., $SiO^2$) is placed in compartment 8 and the group II metal source (e.g., lime) is placed in compartment 10. Upon heating of the reactor 2 to the requisite temperature for the requisite time, substantially pure silicon carbide whiskers (w) will grow on the interior surface of the crucible 4 and lid 6 immediately above the compartment 10 as illustrated.

Figure 2:
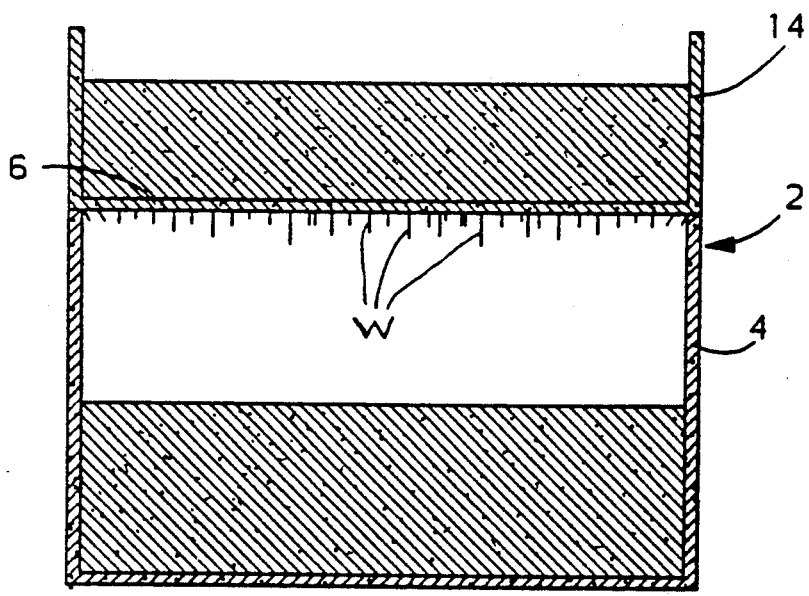
FIG. 2 is a sectioned side view of another embodiment of a reactor for carrying out the process of the present invention.

In the embodiment shown in FIG. 2, the crucible 4 is filled with a mixture of sulfur and the silicon source (e.g., $Si_3N_4$) and a second crucible 14 placed atop the first crucible 4 such that the bottom of the second crucible 14 forms the lid 6 for the first crucible 4. The group II metal source (e.g., lime) is placed in the second crucible, and upon heating to the requisite temperature, silicon carbide whiskers (w) will grow on the underside of the bottom of the second crucible 14 (e.g., lid 6 of first crucible 4) as illustrated.

Figure 3:
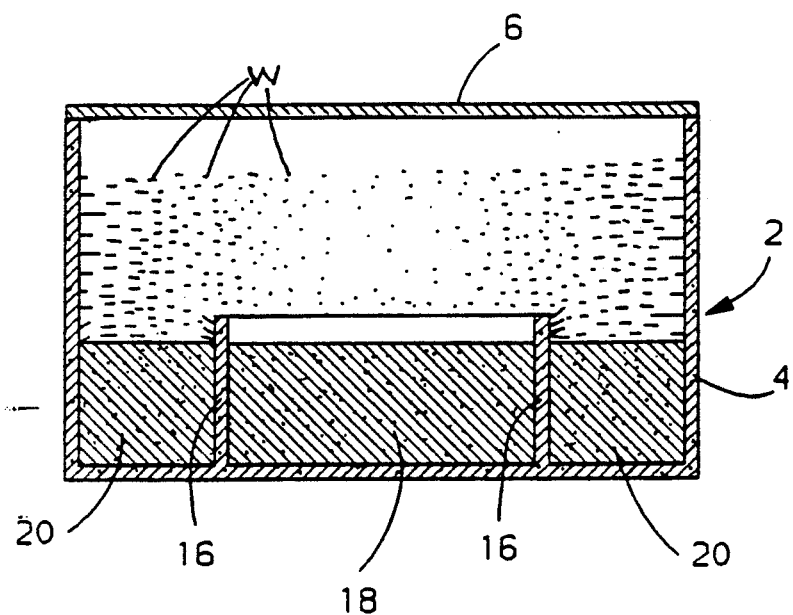
FIG. 3 is a sectioned side view of another embodiment of a reactor for carrying out the process of the present invention.

In the embodiment shown in FIG. 3, the crucible 4 has a central compartment 18 formed by an inner annular partition 16 for containing the sulfur/silicon source reactants and a second annular compartment 20 circumscribing the compartment 18 for containing the group II metal source (e.g., lime). Heating of this reactor 2 to the requisite temperature will cause silicon carbide whiskers (w) to grow on substantially the entire inner surface of the reactor 2 and partition 16 above the reactant beds as illustrated.

Figure 4:
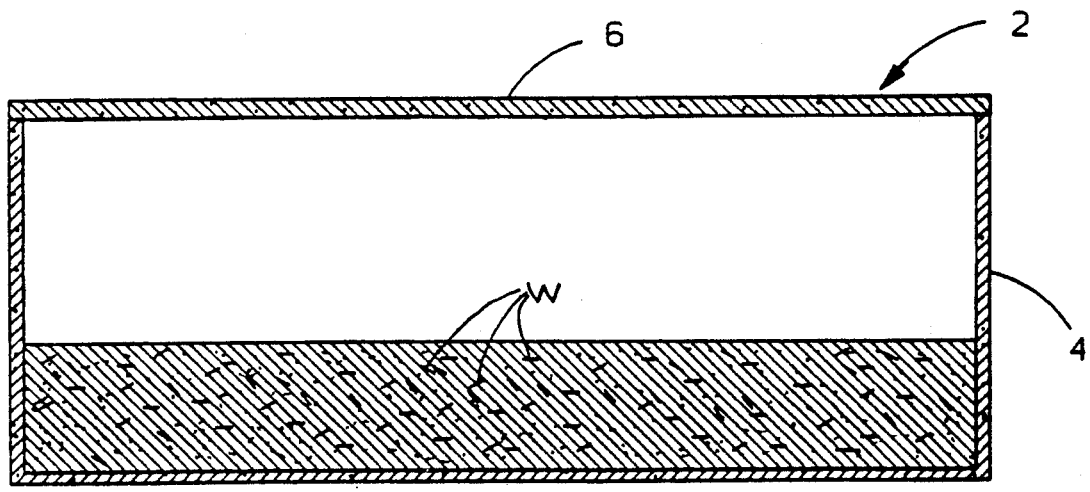
FIG. 4 is a sectioned side view of still another embodiment of a reactor for carrying out the process of the present invention.

In the embodiment shown in FIG. 4, the crucible 4 contains a mixture of the silicon source material, sulfur, group II metal source material and powdered carbon (e.g., carbon black). Heating of this reactor 2 to the requisite temperature will cause silicon carbide whiskers (w) to form not only on substantially the entire inside surface of the reactor 2 above the bed of reactants but also throughout the bed of reactants (as illustrated in FIG. 4). In this embodiment, the particulate carbon throughout the reactant bed also serves as the substrate for silicon carbide whisker growth.

Figure 5:
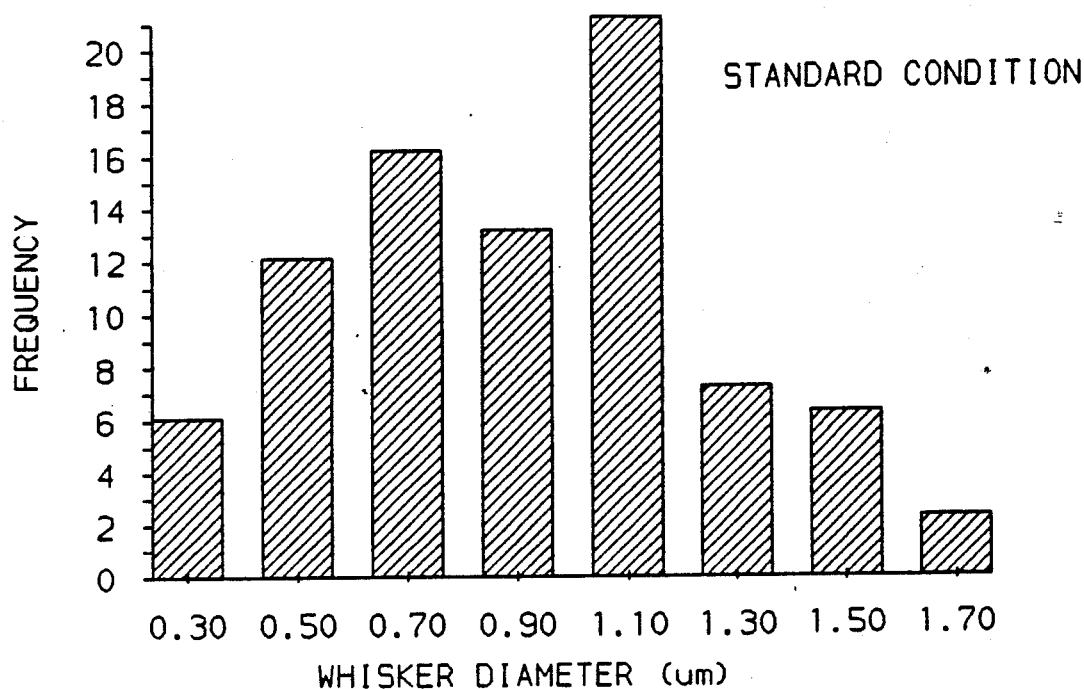
FIGS. 5–12 are histograms for silicon carbide whiskers grown under various conditions within the scope of the present invention.

A number of tests were conducted at various temperatures, with and without different reactants, and using different sources for the silicon, sulfur and group II metal. Atmospheres containing pure nitrogen as well as nitrogen with a small amount of hydrogen present were also tested. Most of these tests were conducted using the reactor arrangement shown in FIG. 2 wherein a lower graphite crucible 4 contained the silicon and sulfur sources and the upper graphite crucible 14 contained the group II metal source. The crucibles were heated to the desired temperature in a flowing nitrogen atmosphere (with and without a small amount of hydrogen). For purposes of comparing results obtained, a reference set of conditions was established and is hereinafter referred to as "standard conditions". The standard conditions used a mixture of silicon nitride ($Si_3N_4$) and sulfur in the lower graphite crucible 4, lime in the upper graphite crucible 14, a gas comprising 96% nitrogen and 4% hydrogen flowing through the furnace, and wherein the reactants were held in the furnace for 45 minutes at 1800° C. High purity silicon carbide whiskers formed under these "standard" conditions were found depending from the underside (i.e., where the group II metal concentration in reactor 4 is the highest) of the bottom of the uppermost crucible 14 sitting atop the lower crucible 4 and had an average diameter of about 0.86 micrometers (see FIG. 5). Variations from these standard conditions were employed to determine what affects such variations might have on whisker growth and quality. In this regard, different temperatures ranging from 1500°–1900° C. were used, various reactants were removed and/or substitutions made therefor in different combinations. In some cases, lime was eliminated and in others hydrogen was removed from the nitrogen atmosphere. In still other cases, barium oxide, magnesium oxide or calcium sulfide was substituted for the lime and silicon dioxide was substituted for silicon nitride. Still further, for some tests all sources of hydrogen (e.g., $H_2$ or $H_2O$ absorbed on the reactants) was eliminated from the system. Yields were determined by weighing the amount of whiskers produced under the different conditions, and SEM microscopy was used to characterize the whisker microstructure and to determine whisker diameter distribution histograms shown in FIGS. 5–12. The whisker diameter distributions were determined by measuring those whiskers which intercepted a randomly-placed test line.

The tests showed that when sulfur was eliminated from the standard conditions it was not possible to grow whiskers. The same held true when argon was substituted for the nitrogen. On the other hand, when hydrogen and $H_2O$ were completely removed from the system the whisker yield more than doubled over that produced under standard conditions. Simply eliminating the 4% hydrogen from the nitrogen atmosphere, however, yielded only about a quarter (¼) of that produced under standard conditions indicating that the absence of absorbed moisture in the reactants is quite important. When silicon dioxide was substituted for the silicon nitride the yield dropped to about 73% of that produced under standard conditions and the whiskers had a rougher surface indicative of the presence of stacking faults in the whisker. As the temperatures dropped, so did the yield. At 1750° C., and otherwise standard conditions, the yield was only 55% of that produced at 1800° C., and at 1700° C. only 50% of that which was produced at 1800° C. At 1600° C. only 29% of that produced at the 1800° level was achieved. At 1500° C. no whiskers at all were produced. Above 1800° C. virtually no whiskers formed, and the ones that did grow, grew in clusters, had rough surfaces and were contaminated with precipitates of wollastonite ($CaSiO_3$) Substituting calcium sulfide for calcium oxide resulting in a yield which was only 32% of that produced with the calcium oxide under standard conditions. Complete elimination of the calcium oxide reduced the yield to 12% of that produced under standard conditions. Substitution of MgO for the CaO reduced the yield but resulted in larger diameter whiskers. Substitution of BaO for CaO reduced the yield even further. Substitution of calcium sulfide for calcium oxide, in the absence of sulfur, yielded no whiskers whatsoever. Use of elemental silicon as the silicon source yielded no whiskers. Adding the sulfur to the lime in the top crucible resulted in the production of no whiskers.

The whiskers produced under the different test conditions varied in diameter and appearance. Considerable differences, for example, existed between the diameters of the whiskers produced at different temperatures (otherwise standard conditions) as shown in FIGS. 5-8 which are the histograms of the silicon carbide whiskers produced at the four different temperatures shown in the Figures. The maximum average whisker diameter and minimum diameter variability occurred at 1750° C.

Figure 6:
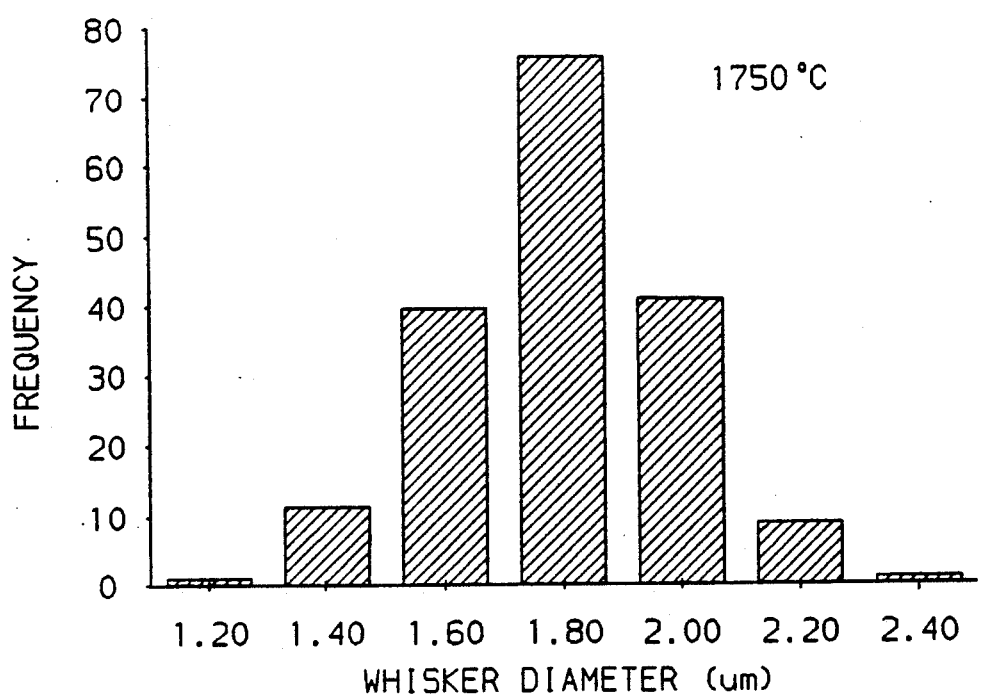
Figure 7:
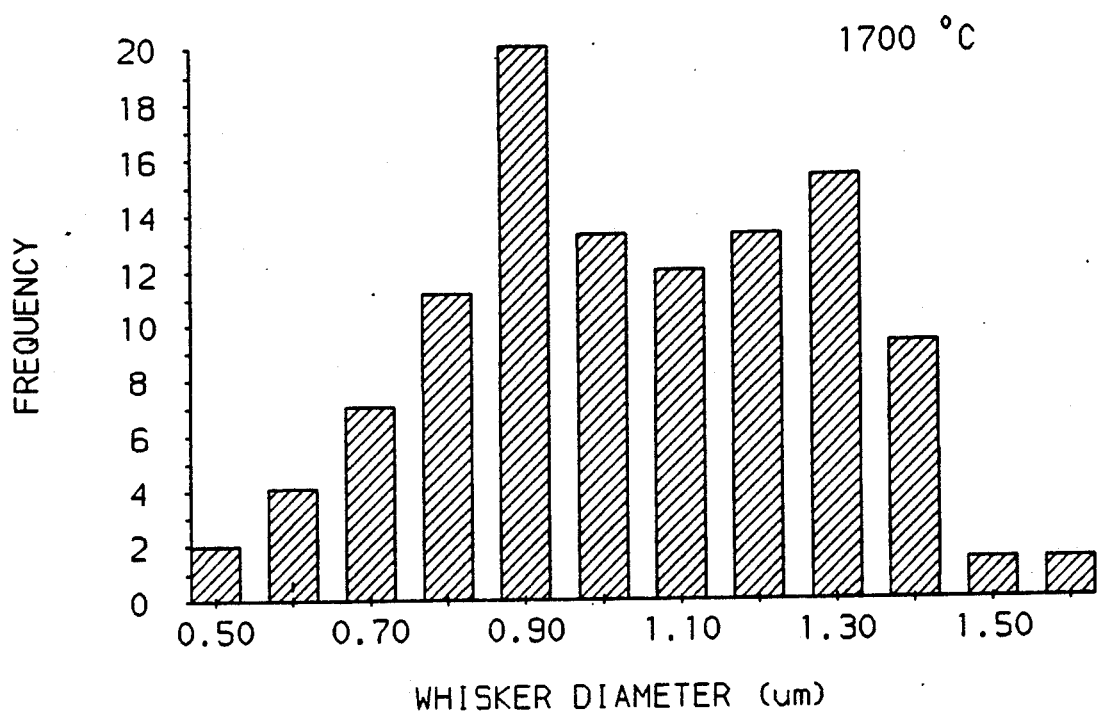
Figure 8:
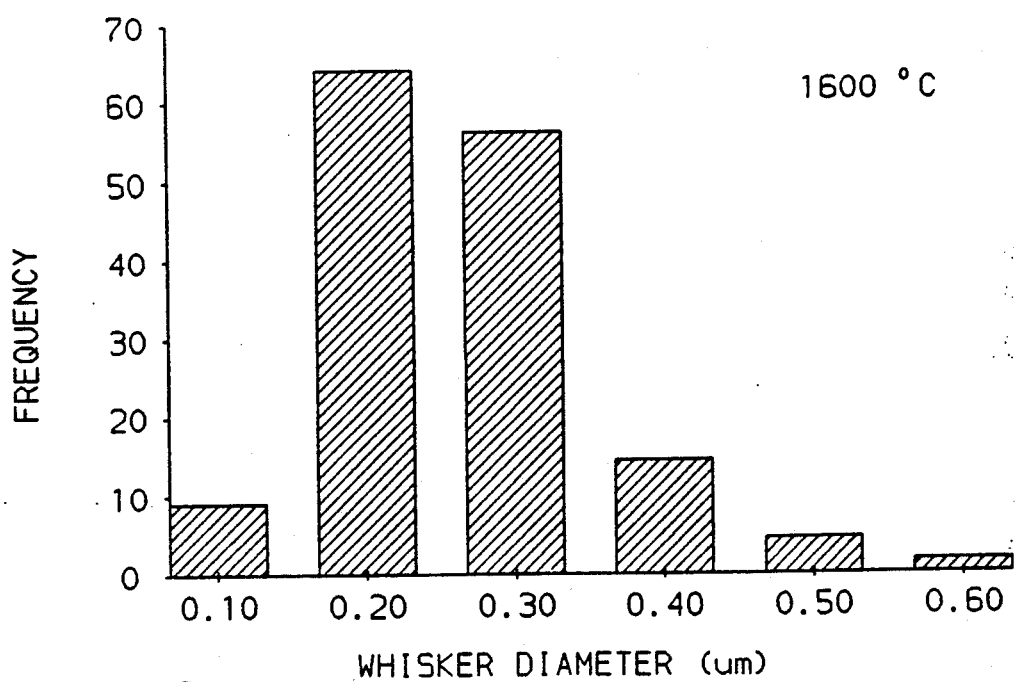
Figure 9:
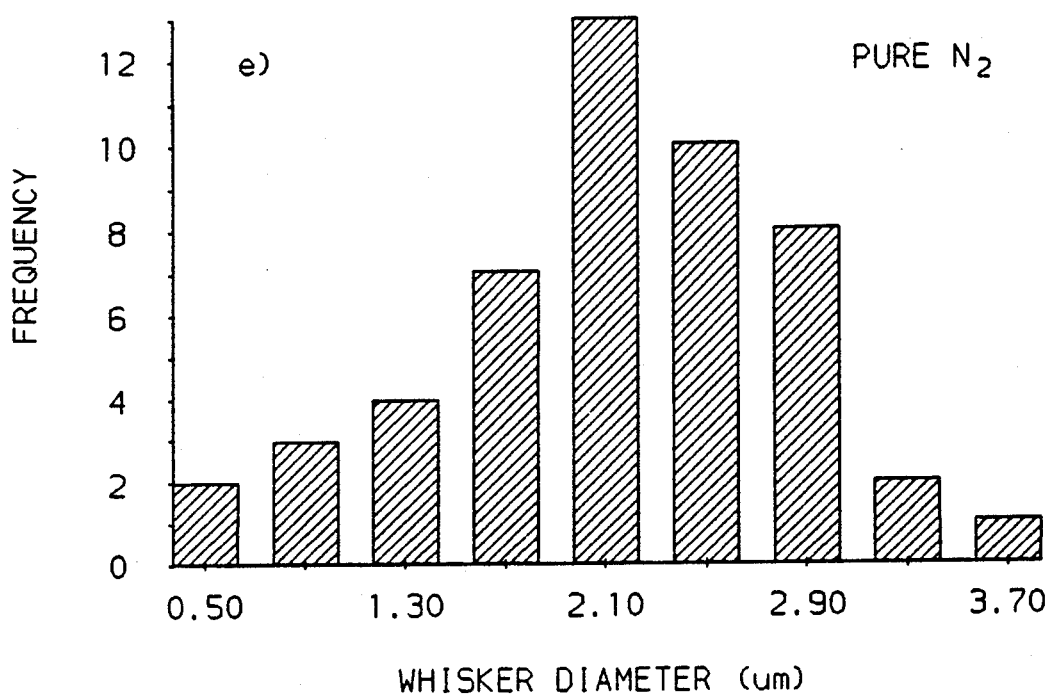
Figure 10:
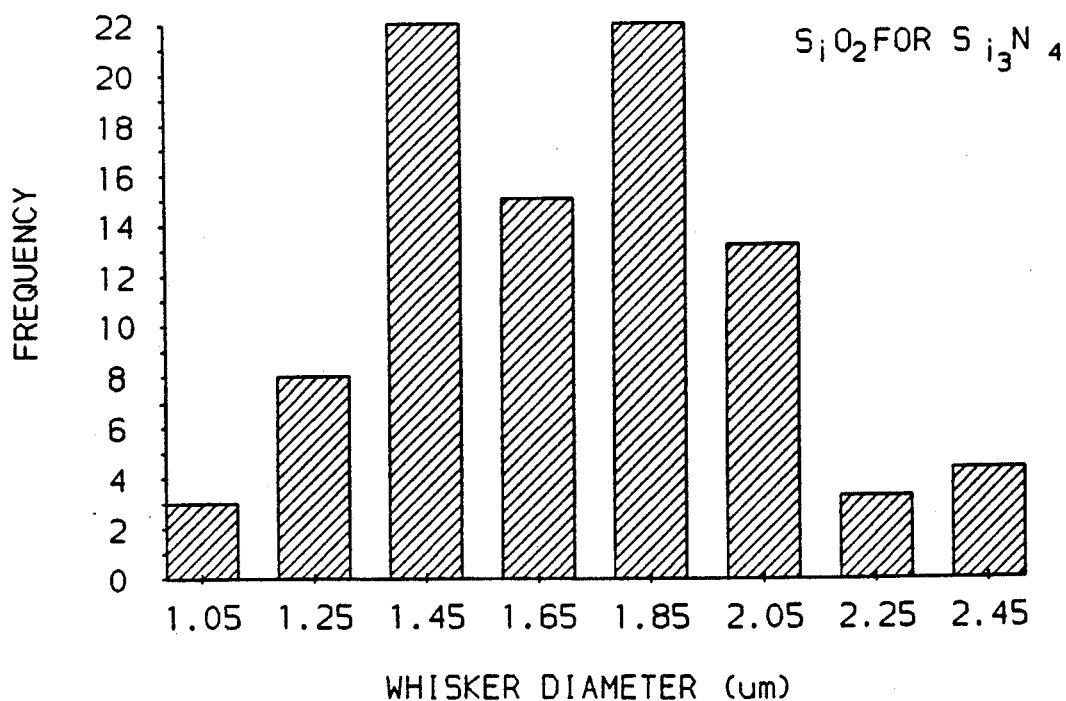
Figure 11:
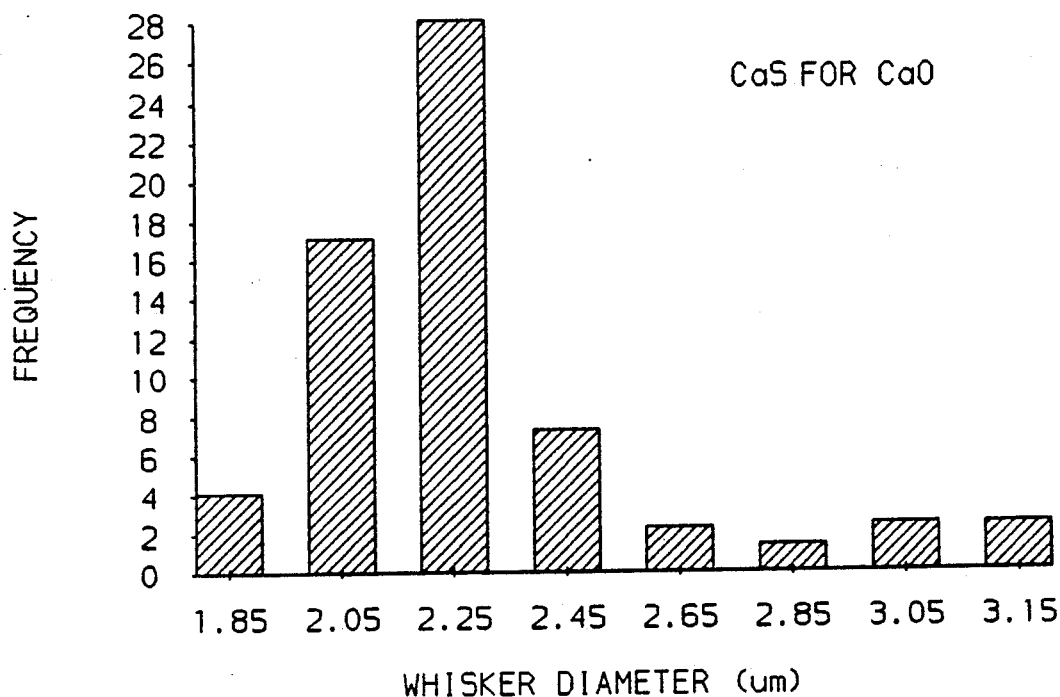
Figure 12:
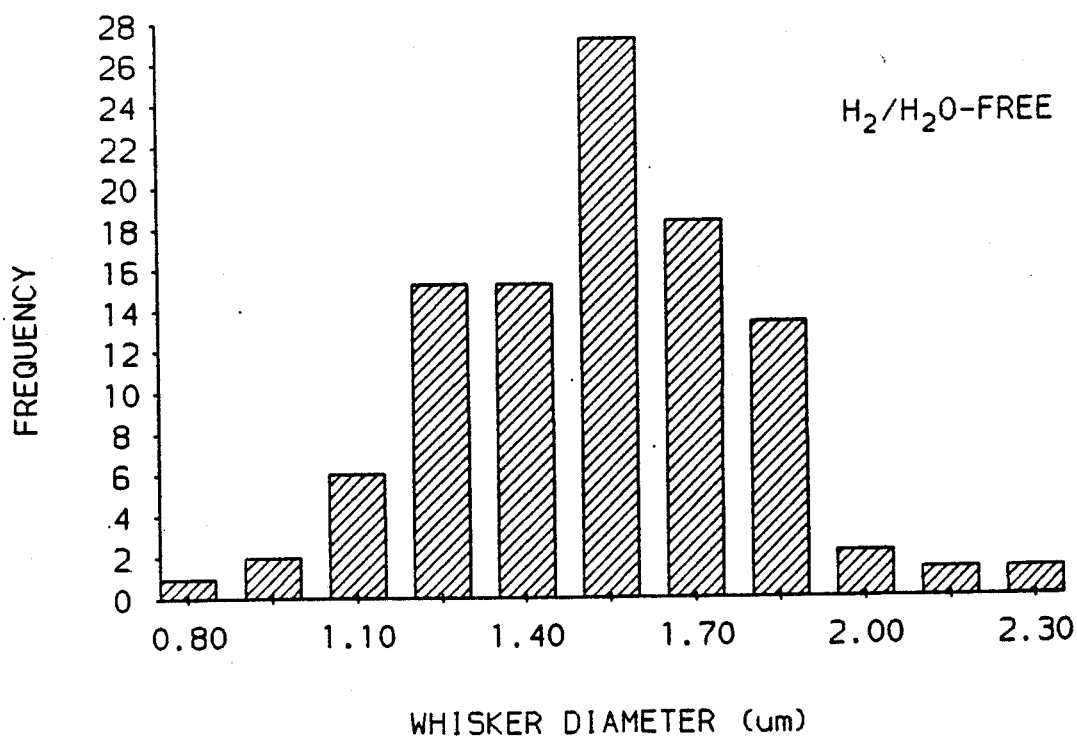

At 1750° C., the result was an average diameter of about 1.8 micrometers with all of the whiskers being well above the 1 micrometer diameter size (see FIG. 6). Thus about 1750° C. appears to be an optimal temperature for consistently producing thicker whiskers. At 1700° C. (see FIG. 7) the average whisker diameter was 1.04 micrometers, and at 1600° C. (see FIG. 8) only 0.27 micrometers in diameter. Other changes to the experimental conditions also affected the average diameter of the whiskers as shown in the other histograms shown in FIGS. 9-12. In FIG. 9, for example, the use of pure nitrogen (i.e., sans the 4% $H_2$) as the atmosphere in the furnace resulted in silicon carbide whiskers having an average diameter of about 2.08 micrometers. As shown in FIG. 10, substitution of silicon dioxide for silicon nitride resulted in whiskers having an average diameter of about 1.7 micrometers. As shown in FIG. 11, substitution of calcium sulfide for lime resulted in whiskers having an average diameter of 2.26 micrometers. As shown in FIG. 12, elimination of all extraneous hydrogen and moisture from the system resulted in whiskers having an average diameter of 1.47 micrometers.

Removal of all sources of hydrogen (including absorbed moisture) from the reaction caused two advantageous effects, whisker yield and diameter both increased and diameter variability decreased. Substituting less expensive silicon dioxide for silicon nitride doubles the whisker diameter and improves the variability although the yield drops somewhat. All the whiskers produced with the silicon dioxide were above 1 micrometer in diameter, but were not as smooth as those produced with the silicon nitride. The $SiO_2$ grown whiskers appear to have growth steps which may make them somewhat weaker than the smoother grown whiskers obtained using $Si_3N_4$. Substitution of calcium sulfide for calcium oxide also produced a rougher surface whisker having a large diameter, small variability and significantly reduced yield (i.e., about 32% of those produced under standard conditions). Whiskers produced with calcium sulfide had the largest minimum whisker diameter and all whiskers produced were above 1.8 micrometers. Removal of the 4% hydrogen content from the nitrogen atmosphere produced smooth, large diameter whiskers but at a yield of only 23% of that produced under standard conditions. Elimination of the lime resulted in the lowest yield and smallest whisker diameter.

A number of tests were conducted which produced no whiskers at all. For example, silicon metal was found to be an ineffective source of silicon for the whisker reaction, and in the absence of sulfur and/or nitrogen, no whiskers grew. The presence of sulfur in the reactor (i.e., with the silicon and carbon) is seen to be important in order to provide a high concentration of sulfur vapor at temperatures before the final reaction temperature is reached to facilitate nucleation of the SiC whiskers. Once the silicon carbide has been nucleated, growth of the whiskers is linear with time and, under standard conditions, has been shown to grow at a rate of about 670 micrometers per hour which is substantially greater than most other processes except one which relies on a manufactured organic precursor as a fundamental part of the reaction. In the embodiments shown in FIGS. 1-3, the silicon carbide whiskers produced appeared to nucleate off of blocky silicon carbide particles found growing on the surface of the graphite crucible above the reactants. These silicon carbide particles have cone-shaped projections, and, a long SiC whisker of uniform cross-section grows from the tip of each cone. The presence of this blocky silicon carbide precipitate at the base of the whisker serves to confirm the fact that whisker growth is taking place at the tip.

Silicon carbide growing on the walls of the reactor are easily harvested by scrapping and, unlike many other processes, are virtually free of contamination. This eliminates the need for costly purification equipment for separating the whiskers from the contaminates. Nonetheless, the silicon carbide whiskers may also be grown within the mass of reactants itself by admixing carbon particulates (e.g., carbon black) with the silicon source, sulfur and group II metal source and heating the mass in the nitrogenous atmosphere at the aforesaid temperature such that the silicon carbide nucleates on the carbon black throughout the mass (see FIG. 4). While this variation of the process is likely to provide a high yield, the silicon carbide whiskers produced must be separated from the unreacted ingredients and reaction by-products thereby requiring additional costs associated with the purchase and operation of purification/separation/beneficiation equipment.

The precise reaction mechanism taking place at these high temperatures is not completely understood. The following reaction accounts for all the raw materials used and products obtained in the reaction:

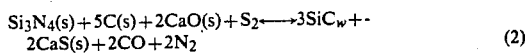

$$Si_3N_4(s)+5C(s)+2CaO(s)+S_2\longrightarrow 3SiC_w+ \\ 2CaS(s)+2CO+2N_2 \qquad (2)$$

However, since the whiskers grow apart from the raw materials, it is clear that the solids do not react directly together to form the silicon carbide whiskers, but rather react to create gaseous species which combine to produce the silicon carbide whiskers. It is the precise nature of these gaseous species that are for the most part unknown. However, since there is no evidence of a liquid bead having been formed (typical of a V-L-S type process) on the ends of the SiC produced by the process of the present invention, it is clear that the process of the present invention is a vapor-solid type process. It is likewise clear that the reactant gases need to contain both carbon and silicon in sufficient quantity to account for the rapid growth rate observed. The presence of sulfur and nitrogen is also necessary and, although their function is not known, they may be directly involved in either carbon or silicon transport. On the other hand, perhaps sulfur serves to favorably increase the partial pressure of the reactants, or, if it does not enter into the reaction, may serve to nucleate whisker formation. It may also affect the whisker's morphology (e.g., by poisoning certain surfaces, etc.). Clearly the presence of the group II metal (e.g., lime) and the absence hydrogen and H$_2$O greatly enhance the reaction.

Based on the observations made during the tests and the principles of thermodynamics and kinetics, certain gaseous reactant species emerge as being more likely candidate participants in the reaction than others. In this regard, since the growth reaction was enhanced by the absence of any hydrogen-containing species, it is clear that such species are not a major part of the reaction mechanism thereby permitting the elimination of such species as C$_2$H$_2$ and HCN from consideration. Rather, the more likely carbon-containing gaseous reactants are, CN, CO, CO$_2$, CS, or C$_2$N$_2$, and the silicon-containing reactants are Si, SiO, SiS, or Si$_2$C. Reactions which do not contain one or more of each of these groups of reactants can seemingly be ruled out. The estimated concentrations (i.e., partial pressures) of each of the aforesaid candidate reactants present under standard conditions (assuming equilibrium) are set forth in Table I hereafter.

TABLE I

| Gaseous Species | Partial Pressure Atmospheres | Gaseous Species | Partial Pressure Atmospheres |
|---|---|---|---|
| CN | $1.404 \times 10^{-6}$ | | |
| CO | $5.934 \times 10^{-1}$ | | |
| CO$_2$ | $5.619 \times 10^{-6}$ | Si | $1.123 \times 10^{-4}$ |
| | | Si$_3$ | $3.030 \times 10^{-7}$ |
| CS | $5.599 \times 10^{-7}$ | SiO | $9.269 \times 10^{-2}$ |
| C$_2$N$_2$ | $1.444 \times 10^{-6}$ | SiS | $3.563 \times 10^{-3}$ |
| *Ca | $8.052 \times 10^{-3}$ | Si$_2$C | $6.105 \times 10^{-5}$ |
| *CaS | $2.701 \times 10^{-7}$ | Si$_2$ | $1.477 \times 10^{-6}$ |
| *N$_2$ | $4.699 \times 10^{-1}$ | *S | $1.677 \times 10^{-8}$ |

*Also present in the concentrations indicated

SPECIFIC EXAMPLE

SiC whiskers were grown under standard conditions as follows. 30 grams of Si$_3$N$_4$ was mixed with 5 grams of sulfur and placed in the lower crucible of the reactor shown in FIG. 3. 15 grams of lime was placed in the upper crucible of the reactor illustrated in FIG. 3. The reactor was placed in a carbon furnace and a gas comprising 96% N$_2$ and 4% H$_2$ provided the furnace at a pressure of 2-5 psig. The furnace was heated up to a temperature of 1800° C. over a period of 90 minutes and held at that temperature for 45 minutes. The furnace was thereafter cooled to room temperature over a period of 180 minutes The SiC whiskers produced had an average diameter of about 0.86 micrometers, an aspect ratio greater than about 200:1, grew at a rate of about 670 micrometers per hour and had a substantially uniform cross-section and smooth surface.

While the invention has been disclosed primarily in terms of certain specific embodiments thereof it is not intended to be limited thereto but rather only to the extent set forth hereafter in the claims which follows.

The embodiments of the invention in which an exclusive property or privilege is claimed are defined as follows:

1. A method for growing silicon carbide whiskers on a carbon substrate comprising the steps of heating said substrate to a temperature of at least about 1600° C. and less than about 1800° C. and contacting said heated substrate with a similarly heated reactive atmosphere consisting essentially of gaseous species of silicon, carbon, nitrogen, sulfur, and a group II metal selected from the group consisting of calcium, magnesium and barium in concentrations effective to produce said whiskers.

2. A method for growing silicon carbide whiskers on a carbon substrate comprising the steps of heating said substrate to a temperature of at least about 1600° C. and less than about 1800° C., contacting said substrate with a gaseous nitrogenous, reactive atmosphere produced by heating sources of silicon and carbon to said temperature in the presence of sulfur vapor and a group II metal vapor selected from the group consisting of calcium, barium and magnesium.

3. The method according to claim 2 wherein said silicon source is selected from the group consisting of silicon dioxide (SiO$_2$) and silicon nitride (Si$_3$N$_4$).

4. The method according to claim 3 wherein said group II metal vapor is formed by heating a compound selected from the group consisting of sulfides and oxides of said group II metal.

5. The method according to claim 4 wherein said sulfur vapor is formed by heating elemental sulfur together with said silicon and carbon sources.

6. The method according to claim 5 wherein said carbon substrate is graphite.

7. The method according to claim 5 said carbon source comprises carbon particles in admixture with said silicon source.

8. The method according to claim 5 wherein said sulfur is admixed with said silicon source.

9. The method according to claim 5 wherein said temperature is about 1750° C. to about 1800° C.

10. A method for growing silicon carbide whiskers on a carbon substrate comprising the steps of heating said substrate to a temperature between about 1700° C. and 1800° C. in a nitrogen-containing reactor, contacting said substrate with a gaseous reactive atmosphere produced by heating together in said reactor a silicon vapor source selected from the group consisting of silicon nitride (Si$_3$N$_4$) and silicon dioxide (SiO$_2$), a group II metal vapor source selected from the group consisting of calcium, barium and magnesium oxides or sulfides and sulfur so as to produce said atmosphere with a group II metal vapor content which is in vapor phase equilibrium with said group II metal source and a sulfur vapor content which is in vapor phase equilibrium with the sulfide of said group II metal.

11. The process according to claim 10, wherein said group II metal source is calcium oxide.

12. A method for growing silicon carbide whiskers on a carbon substrate comprising the steps of heating said substrate to a temperature between about 1700° C. and 1800° C. in a substantially hydrogen-free, nitrogenous atmosphere consisting essentially of carbon-containing vapor, silicon-containing vapor, sulfur-containing vapor and a metal vapor selected from the group consisting of calcium, barium and magnesium.

13. The method according to claim 12 wherein said substrate contacts said atmosphere at said temperature for a time sufficient to grow whiskers having an average aspect ratio greater than 20:1.

14. The method according to claim 2 wherein said silicon source is silicon nitride.

15. The method according to claim 2 wherein said method is carried out in a graphite reactor, said whiskers grow on the inside surfaces of said reactor, and said whiskers are harvested from said surfaces substantially uncontaminated with unreacted reactants or reaction by-products.

* * * * *